United States Patent
Yu et al.

(10) Patent No.: US 9,899,517 B2
(45) Date of Patent: *Feb. 20, 2018

(54) DISLOCATION STRESS MEMORIZATION TECHNIQUE (DSMT) ON EPITAXIAL CHANNEL DEVICES

(71) Applicant: Taiwan Semiconductor Manufacturing Co., Ltd., Hsin-Chu (TW)

(72) Inventors: Tsung-Hsing Yu, Taipei (TW); Shih-Syuan Huang, Taichung (TW); Yi-Ming Sheu, Hsinchu (TW); Ken-Ichi Goto, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/345,814

(22) Filed: Nov. 8, 2016

(65) Prior Publication Data

US 2017/0054022 A1   Feb. 23, 2017

Related U.S. Application Data

(60) Continuation of application No. 14/880,392, filed on Oct. 12, 2015, now Pat. No. 9,502,559, which is a
(Continued)

(51) Int. Cl.
*H01L 29/78* (2006.01)
*H01L 29/16* (2006.01)
(Continued)

(52) U.S. Cl.
CPC .... *H01L 29/7847* (2013.01); *H01L 21/26513* (2013.01); *H01L 21/26593* (2013.01);
(Continued)

(58) Field of Classification Search
CPC .................................................. H01L 29/7847
See application file for complete search history.

(56) References Cited

U.S. PATENT DOCUMENTS

| 5,355,006 A | 10/1994 | Iguchi |
| 5,561,302 A | 10/1996 | Canderlaria |

(Continued)

FOREIGN PATENT DOCUMENTS

| KR | 20100080159 A | 7/2010 |
| KR | 20130049540 A | 5/2013 |
| TW | 201349304 A | 12/2013 |

OTHER PUBLICATIONS

Chih-Cheng Lu, et al.; "Strained Silicon Technology: Mobility Enhancement and Improved Short Channel Effect Performance by Stress Memorization Technique on nFET Devices"; Journal of the Electrochemical Society; Oct. 8, 2009, p. 1-4.

(Continued)

*Primary Examiner* — Thao P Le
(74) *Attorney, Agent, or Firm* — Eschweiler & Potashnik, LLC

(57) ABSTRACT

The present disclosure relates to a transistor device having epitaxial source and drain regions with dislocation stress memorization (DSM) regions that provide stress to a channel region. In some embodiments, the transistor device has an epitaxial source region arranged within a substrate. An epitaxial drain region is arranged within the substrate and is separated from the epitaxial source region by a channel region. A first DSM region, which has a stressed lattice configured to generate stress within the channel region, extends from below the epitaxial source region to a location within the epitaxial source region. A second DSM region, which has a stressed lattice configured to generate stress
(Continued)

within the channel region, extends from below the epitaxial drain region to a location within the epitaxial drain region.

20 Claims, 7 Drawing Sheets

Related U.S. Application Data division of application No. 14/252,147, filed on Apr. 14, 2014, now Pat. No. 9,419,136.

(51) Int. Cl.

| H01L 29/167 | (2006.01) |
|---|---|
| H01L 29/417 | (2006.01) |
| H01L 29/423 | (2006.01) |
| H01L 29/66 | (2006.01) |
| H01L 29/10 | (2006.01) |
| H01L 29/06 | (2006.01) |
| H01L 29/24 | (2006.01) |
| H01L 21/265 | (2006.01) |

(52) U.S. Cl.
CPC ...... *H01L 29/0603* (2013.01); *H01L 29/1083* (2013.01); *H01L 29/167* (2013.01); *H01L 29/1608* (2013.01); *H01L 29/24* (2013.01); *H01L 29/41766* (2013.01); *H01L 29/42364* (2013.01); *H01L 29/6656* (2013.01); *H01L 29/6659* (2013.01); *H01L 29/66477* (2013.01); *H01L 29/66545* (2013.01); *H01L 29/66636* (2013.01); *H01L 29/7848* (2013.01); *H01L 21/26586* (2013.01)

(56) References Cited

U.S. PATENT DOCUMENTS

| 6,040,208 | A | 3/2000 | Honeycutt et al. |
|---|---|---|---|
| 6,215,148 | B1 | 4/2001 | Eitan |
| 6,541,343 | B1 | 4/2003 | Murthy et al. |
| 6,566,204 | B1 | 4/2003 | Wang et al. |
| 6,589,847 | B1 | 7/2003 | Kadosh et al. |
| 6,849,890 | B2 | 2/2005 | Kokubun |
| 7,276,407 | B2 | 10/2007 | Yamagata et al. |
| 7,507,999 | B2 | 3/2009 | Kusumoto et al. |
| 7,943,468 | B2 | 5/2011 | Curello et al. |
| 7,952,149 | B2 | 5/2011 | Dokumaci et al. |
| 8,034,679 | B1 | 10/2011 | Bulucea |
| 8,298,895 | B1 | 10/2012 | Alptekin |
| 8,404,546 | B2 | 3/2013 | Woon et al. |
| 8,557,659 | B2 | 10/2013 | Teo et al. |
| 8,569,156 | B1 | 10/2013 | Scudder et al. |
| 8,659,054 | B2 | 2/2014 | Rim et al. |
| 8,669,615 | B1 | 3/2014 | Chang et al. |
| 8,772,095 | B2 | 7/2014 | Kim et al. |
| 9,224,814 | B2 | 12/2015 | Yu et al. |
| 9,419,136 | B2 * | 8/2016 | Yu ...................... H01L 29/7847 |
| 2001/0004332 | A1 | 6/2001 | Eitan |
| 2002/0033511 | A1 | 3/2002 | Babcock et al. |
| 2003/0008484 | A1 | 1/2003 | Hook |
| 2003/0075719 | A1 | 4/2003 | Sriram |
| 2005/0023535 | A1 | 2/2005 | Sriram |
| 2005/0173739 | A1 | 8/2005 | Kusumoto et al. |
| 2005/0285212 | A1 | 12/2005 | Tolchinsky et al. |
| 2006/0065937 | A1 | 3/2006 | Hoffmann et al. |
| 2006/0220098 | A1 | 10/2006 | Lee et al. |
| 2006/0286729 | A1 * | 12/2006 | Kavalieros ........ H01L 21/28079 438/183 |
| 2007/0190731 | A1 | 8/2007 | Chen et al. |
| 2008/0195983 | A1 | 8/2008 | Chidambarrao et al. |
| 2008/0237709 | A1 | 10/2008 | Chidambarrao et al. |
| 2008/0242032 | A1 | 10/2008 | Chakravarthi et al. |
| 2008/0272395 | A1 | 11/2008 | Banna |
| 2008/0272408 | A1 * | 11/2008 | Vora .................. H01L 21/761 257/272 |
| 2009/0289280 | A1 | 11/2009 | Zhang et al. |
| 2010/0317169 | A1 | 12/2010 | Sung et al. |
| 2010/0330763 | A1 | 12/2010 | Freeman et al. |
| 2011/0031503 | A1 | 2/2011 | Doris et al. |
| 2011/0079861 | A1 | 4/2011 | Shifren et al. |
| 2011/0215376 | A1 | 9/2011 | Holt et al. |
| 2012/0135575 | A1 | 5/2012 | Wong et al. |
| 2013/0113041 | A1 | 5/2013 | Liu et al. |
| 2013/0200455 | A1 | 8/2013 | Lo et al. |
| 2014/0197411 | A1 | 7/2014 | Vakada et al. |
| 2014/0252504 | A1 | 9/2014 | Chuang et al. |
| 2015/0028426 | A1 * | 1/2015 | Ching .................. H01L 29/785 257/401 |
| 2015/0243759 | A1 | 8/2015 | Huang et al. |
| 2015/0263092 | A1 | 9/2015 | Hsiao et al. |
| 2015/0295085 | A1 | 10/2015 | Yu et al. |
| 2016/0035892 | A1 | 2/2016 | Yu et al. |

OTHER PUBLICATIONS

S. Flachowsky, et al.; "Stress Memorization Technique for n-MOSFETs: Where is the Stress Memorized?"; ULIS 2010—Ultimate Integration on Silicon; University of Glasgow; Mar. 2010; p. 1-4.
Nuo Xu; "Effectiveness of Strain Solutions for Next-Generation MOSFETs"; University of California—Berkley; Spring 2012; p. 1-103.
Streetman, et al. "Solid State Electronic Devices." Fifth Edition. Published in 2000. pp. 311-315.
Shen, et al. "Molecular Dynamic Simulation Study of Stress Memorization in Si Dislocations." IEEE International Conference: Electron Devices Meeting (IEDM), 2012.
U.S. Appl. No. 13/288,201, filed Nov. 3, 2011.
U.S. Appl. No. 14/156,496, filed Jan. 16, 2014.
U.S. Appl. No. 14/156,505, filed Jan. 16, 2014.
U.S. Appl. No. 14/156,515, filed Jan. 16, 2014.
U.S. Appl. No. 14/208,353, filed Mar. 13, 2014.
U.S. Appl. No. 14/156,546, filed Jan. 16, 2014.
Non-Final Office Action dated Feb. 23, 2015 for U.S. Appl. No. 14/156,546.
Non Final Office Action dated May 15, 2015 U.S. Appl. No. 14/156,515.
Notice of Allowance dated Jun. 26, 2015 for U.S. Appl. No. 14/156,546.
Notice of Allowance dated Aug. 27, 2015 U.S. Appl. No. 14/156,515.
Non Final Office Action dated Aug. 28, 2015 U.S. Appl. No. 14/208,353.
Notice of Allowance dated Sep. 9, 2015 U.S. Appl. No. 14/156,505.
Non Final Office Action dated Nov. 27, 2015 U.S. Appl. No. 14/156,496.
Notice of Allowance dated Mar. 28, 2016 U.S. Appl. No. 14/208,353.
Non Final Office Action dated Apr. 14, 2016 U.S. Appl. No. 14/880,469.
Notice of Allowance dated Sep. 14, 2016 U.S. Appl. No. 14/880,469.
Non Final Office Action dated Oct. 13, 2016 U.S. Appl. No. 14/935,760.
Notice of Allowance dated Jul. 14, 2016 U.S. Appl. No. 14/880,392.

* cited by examiner

DISLOCATION STRESS MEMORIZATION TECHNIQUE (DSMT) ON EPITAXIAL CHANNEL DEVICES

REFERENCE TO RELATED APPLICATIONS

This application is a Continuation of U.S. application Ser. No. 14/880,392 filed on Oct. 12, 2015 which is a Divisional of U.S. application Ser. No. 14/252,147 filed on Apr. 14, 2014 (now U.S. Pat. No. 9,419,136 issued on Aug. 16, 2016). The contents of the above-mentioned Applications are hereby incorporated by reference in their entirety.

BACKGROUND

Modern day integrated circuits comprise millions or billions of transistors devices. Transistors devices operate as switches that allow charge carriers (e.g., electrons) to flow when turned on, and which prevent charge carriers from flowing when turned off. The performance of a transistor is influenced by a charge carrier mobility of a material from which the transistor is made. Charge carrier mobility is a measure of how quickly charge carriers move though a material in the presence of an electric field. Increased charge carrier mobility can provide for faster transistor switching speeds, at a fixed voltage, or lower voltage for the same switching speed.

In recent years, strain engineering has become a widely used method of improving the performance of transistor devices. Strain engineering induces a pressure onto either a channel region and/or onto source and drain regions of a transistor device. The pressure stretches the crystalline lattice of region(s) to increase the distance between atoms beyond their normal inter-atomic distance. By stretching the crystalline lattice, strain engineering increases charge carrier mobility and thereby improves device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
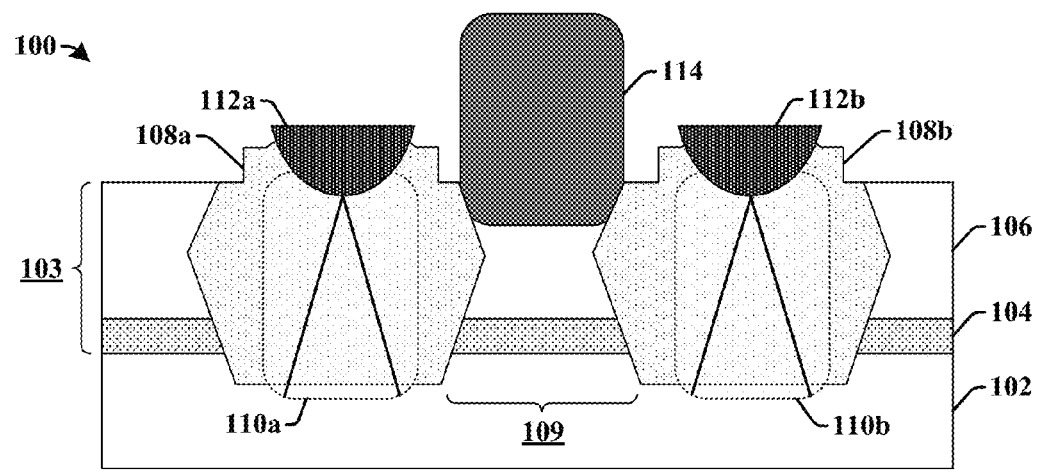
FIG. 1 illustrates some embodiments of a transistor device having epitaxial source and drain regions comprising dislocation stress memorization (DSM) regions configured to provide stress to an epitaxial channel region.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Over the past few decades the semiconductor industry has made continual advances in manufacturing technology, which have allowed for a steady reduction in transistor device size and constant improvement in transistor device performance. However, in recent years, as scaling has begun to reach the physical limitations of materials, scaling has begun to cause a number of problems with transistor devices. For example, as transistor gate lengths continue to decrease, local and global variations of transistor threshold voltages have become worse. For example, during fabrication of an integrated chip, a plurality of separate processing operations are used to form structural features of transistor devices. Such processing operations may introduce dopant impurities into a transistor channel that may cause variations in the threshold voltages of transistor devices and therefore performance degradation. Furthermore, increasing the dose used for pocket implantations, to improve short-channel control of transistor devices, aggravates such threshold voltage variations.

Accordingly, the present disclosure relates to a transistor device having epitaxial source and drain regions comprising dislocation stress memorization (DSM) regions configured to provide stress to an epitaxial channel region, to improve transistor device performance (including short channel control of transistor devices), and an associated method of formation. The transistor device comprises an epitaxial stack disposed over a semiconductor substrate, and a gate structure disposed over the epitaxial stack. An epitaxial source region and an epitaxial drain region are disposed within the epitaxial stack and the semiconductor substrate on opposing sides of the gate structure. A channel region extends below the gate structure between the epitaxial source and drain regions. First and second dislocation stress memorization (DSM) regions respectively extend from below the epitaxial source region to a first location within the epitaxial source region and from below the epitaxial drain region to a second location within the epitaxial drain region. The first and second DSM regions comprise material of the epitaxial source and drain regions and the semiconductor substrate and have a stressed lattice configured to generate stress within the channel region, to improve device performance.

FIG. 1 illustrates some embodiments of a transistor device 100 having epitaxial source and drain regions comprising dislocation stress memorization (DSM) regions configured to provide stress to an epitaxial channel region.

The transistor device 100 comprises a semiconductor substrate 102 (e.g., a silicon substrate). An epitaxial stack 103 having one or more epitaxial layers is disposed over the semiconductor substrate 102. In some embodiments, the epitaxial stack 103 comprises a carbon doped epitaxial layer 104 disposed over the semiconductor substrate 102 and a lightly-doped epitaxial layer 106 (e.g., an epitaxial layer grown without doping, but having a low doping concentration due to back diffusion of dopants from the semiconductor substrate 102) disposed over the carbon doped epitaxial layer 104. A gate structure 114 is disposed over the lightly-doped epitaxial layer 106.

An epitaxial source region 108a and an epitaxial drain region 108b are disposed within the epitaxial stack 103 and semiconductor substrate 102 on opposing sides of the gate structure 114. The epitaxial source and drain regions, 108a and 108b, may comprise a first doping type (e.g., n-type doping for an NMOS transistor) different than a second doping type of the epitaxial layers (p-type). A channel region 109 extends between the epitaxial source region 108a and the epitaxial drain region 108b within the epitaxial stack 103 of the transistor device 100. In some embodiments, the epitaxial source and drain regions, 108a and 108b, may comprise recesses, having a diamond-shape or V-shape, which have been filled with a stress-inducing material. In some embodiments, the stress inducing material may comprise silicon phosphate (SiP) (e.g., for n-channel MOSFET channel mobility enhancement). In other embodiments, the strain inducing material may comprise other materials such as silicon germanium (SiGe), silicon carbide (SiC), etc.

A first dislocation stress memorization (DSM) region 110a and a second DSM region 110b are disposed on opposing sides of the gate structure 114. The first and second DSM regions, 110a and 110b, comprise a re-crystallized amorphous material. The re-crystallized amorphous material of the first and second DSM regions, 110a and 110b, comprises stacking defects, 111a and 111b, along a (111) plane. The stacking defects, 111a and 111b, which can be detected by electron microscopy (e.g., TEM), distort the bond length of the lattice within the first and second DSM regions, 110a and 110b. For example, the stacking defects, 111a and 111b, may cause the first and second DSM regions, 110a and 110b, to have a stressed lattice with a smaller distance between atoms than normal.

The stressed lattices of the first and second DSM regions, 110a and 110b, are configured to induce a stress on the channel region 109, which increases charge carrier mobility and improves short channel effects of the transistor device 100. The first and second DSM regions, 110a and 110b, are also configured to stress a portion of the epitaxial source and drain regions, 108a and 108b, and a portion of the underlying semiconductor substrate 102 (i.e., the first and second DSM regions, 110a and 110b, comprise a semiconductor substrate material having a strained (i.e., re-crystallized) lattice and a source/drain epitaxial material having a strained lattice). In some embodiments, the stressed portion of the semiconductor substrate 102, underlying the source and drain regions, 108 and 108b, may comprise a stress inducing dopant, such as germanium, for example. In some embodiments, the first DSM region 110a may extend from a location below the epitaxial source region 108a to a recessed source contact 112a located along a top surface of the epitaxial source region 108a. Similarly, the second DSM region 110b may extend from a location below the epitaxial drain region 108b to a recessed drain contact 112b located along a top surface of the epitaxial drain region 108b.

Figure 2:
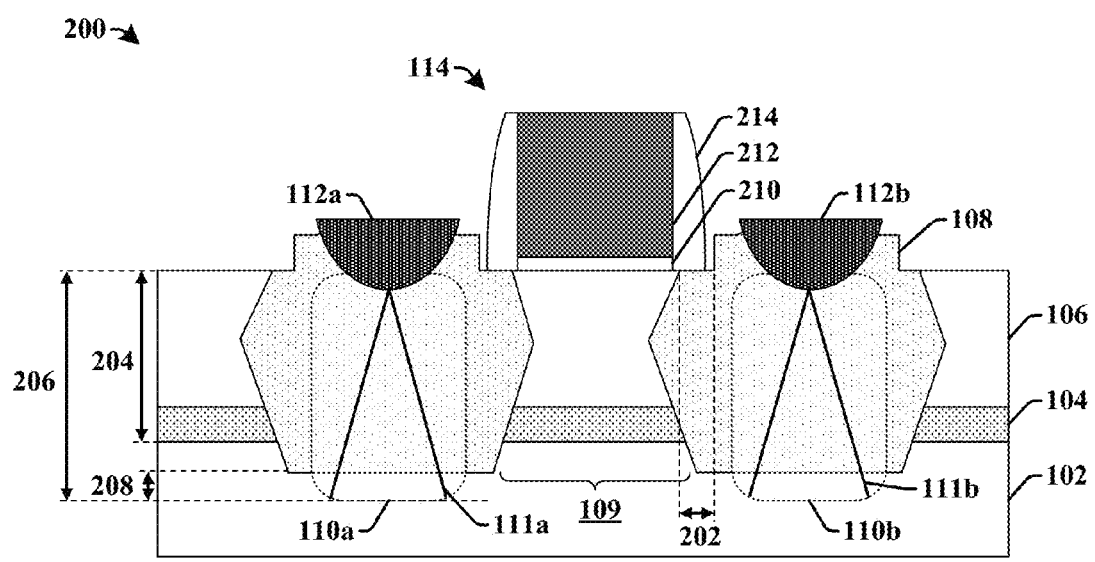
FIG. 2 illustrates some additional embodiments of a transistor device having epitaxial source and drain regions comprising DSM regions configured to provide stress to an epitaxial channel region.

FIG. 2 illustrates some additional embodiments of a transistor device 200 having epitaxial source and drain regions comprising DSM regions configured to provide stress to an epitaxial channel region.

Transistor device 200 comprises a carbon doped epitaxial layer 104 disposed over a semiconductor substrate 102 and a lightly-doped epitaxial layer 106 disposed over the carbon doped epitaxial layer 104. The carbon doped epitaxial layer 104 is configured to augment performance of the transistor device 200 (e.g., to improve local and global threshold voltage and drive current variations within the device) by mitigating dopant back diffusion from the semiconductor substrate 102 and to thereby generate a steep retrograde doping concentration profile of a channel region of transistor device 200. In some embodiments, the carbon doped epitaxial layer 104 may have a carbon doping concentration of less than 1%. In some embodiments, the retrograde doping concentration profile may provide for a doping concentration that is less than 1e18 cm$^{-3}$ at an interface between the lightly-doped epitaxial layer 106 and the gate structure 114.

First and second DSM regions, 110a and 110b, extend along a vertical direction from a location below epitaxial source and drain regions, 108a and 108b, to recessed source and drain contacts, 112a and 112b, located along a top surface of the epitaxial source and drain regions, 108a and 108b, respectively. In some embodiments, the recessed source and drain contacts, 112a and 112b, may comprise nickel. In some embodiments, top surfaces of the DSM regions, 110a and 110b, may have a divot or recess comprising the recessed source and drain contacts, 112a and 112b. In some embodiments, the first and second DSM regions, 110a and 110b, may have a bottom surface that is located at distance 202 below the epitaxial source and drain regions, 108a and 108b, respectively. For example, the first and second DSM regions, 110a and 110b, may extend to a distance 202 of greater than or equal to approximately 2 nm below the epitaxial source and drain regions, 108a and 108b. In some embodiments, a height 204 of the epitaxial stack 103 is less than a height 206 of the first and second DSM regions, 110a and 110b.

The first and second DSM regions, 110a and 110b, extend along a lateral direction from a first position within the epitaxial source and drain regions, 108a and 108b, to a second position within the epitaxial regions, 108a and 108b. In some embodiments, the first and second positions are selected so that the DSM regions, 110a and 110b, have a smaller width than the epitaxial source and drain regions, 108a and 108b. In some embodiments, the first and second DSM regions, 110a and 110b, may be laterally separated from the gate structure 112 by a relatively small distance 208 so as to enhance stress on the channel region. For example, the first or second DSM regions, 110a or 110b, may be separated from the gate structure by a distance 208 that is less than approximately 10 nm.

In some embodiments, the gate structure 114 may comprise a stacked gate dielectric layer 210 and a gate electrode layer 212. The gate dielectric layer 210 (e.g., a silicon dioxide layer, a high-k dielectric layer, etc.) is disposed onto the lightly-doped epitaxial layer 106. The gate electrode layer 212 (e.g., a poly-silicon layer, a replacement metal gate layer, etc.) is disposed onto the gate dielectric layer 210. In some embodiments, the gate dielectric layer 210 and a gate electrode layer 212 may be flanked by sidewall spacers 214. In some embodiments, the sidewall spacers 214 may comprise nitride spacers.

Figure 3:
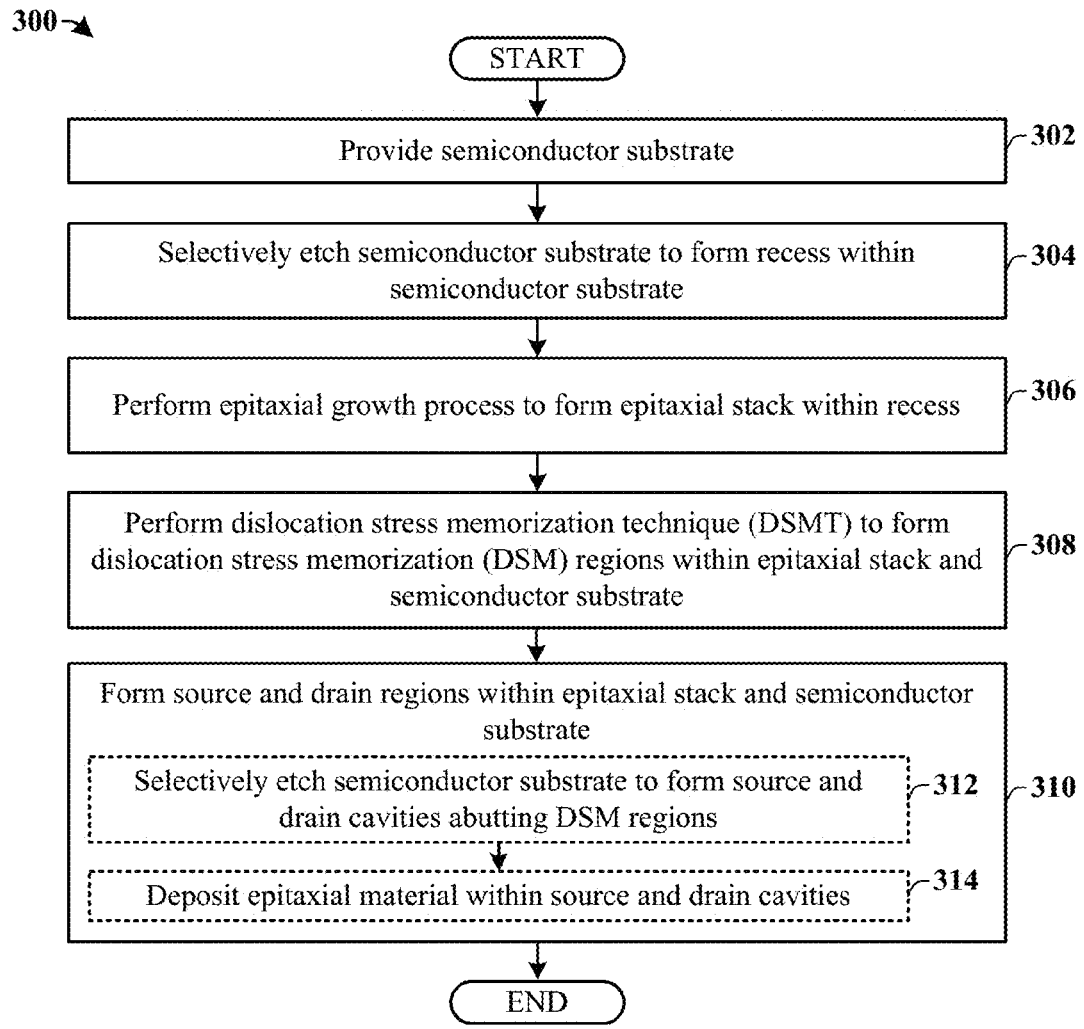
FIG. 3 illustrates a flow diagram of some embodiments of a method of forming a transistor device having epitaxial source and drain regions comprising DSM regions configured to provide stress to an epitaxial channel region.

FIG. 3 illustrates a flow diagram of some embodiments of a method 300 of forming a transistor device having epitaxial source and drain regions comprising DSM regions configured to provide stress to an epitaxial channel region.

At 302, a semiconductor substrate is provided. The semiconductor substrate may comprise an intrinsically doped semiconductor substrate having a first doping type (e.g., an n-type doping or a p-type doping).

At 304, the semiconductor substrate is selectively etched to form a recess within the semiconductor substrate.

At 306, an epitaxial growth process is performed to form an epitaxial stack within the recess. In some embodiments, the epitaxial stack may comprise a carbon doped epitaxial layer (e.g., SiC) and an un-doped epitaxial layer (e.g., silicon). The carbon doped epitaxial layer may be epitaxially grown onto a bottom surface of the recess, while the un-doped epitaxial layer may be epitaxially grown onto the carbon doped epitaxial layer. The carbon doped epitaxial layer is configured to mitigate back diffusion of dopants from the semiconductor substrate to form a steep retrograde doping profile within a channel region which results in a relatively low surface dopant concentration (e.g., less than $1e18$ $cm^{-3}$) that improves threshold voltage and drive current variations.

At 308, a dislocation stress memorization technique (DSMT) is performed to form dislocation stress memorization (DSM) regions within the epitaxial stack and the semiconductor substrate at positions corresponding to source and drain regions of the transistor device. In some embodiments, the DSM regions may have a stressed lattice that has a smaller distance between atoms than normal (i.e., the lattice constant of the DSM region is smaller than the natural lattice constant not being stressed). In other embodiments, the DSM regions may have a stressed lattice that has a larger distance between atoms than normal.

At 310, source and drain regions are formed within the semiconductor substrate at positions that abut a portion of the DSM regions. In some embodiments, the source and drain regions comprise epitaxial source and drain regions. In such embodiments, the epitaxial source and drain regions may be formed by selectively etching the semiconductor substrate to form source and drain cavities abutting a portion of the DSM regions, at 312. In some embodiments, the cavities may comprise a portion of the DSM regions. Epitaxial material is then deposited within the source and drain cavities onto the portion of the DSM regions, at 314. Since the epitaxial material is grown onto a portion of the DSM regions, the epitaxial material will have a stressed lattice due to the stressed lattice of the DSM regions, thereby causing the DSM regions to extend from the semiconductor substrate to the epitaxial source and drain regions.

Figure 4:
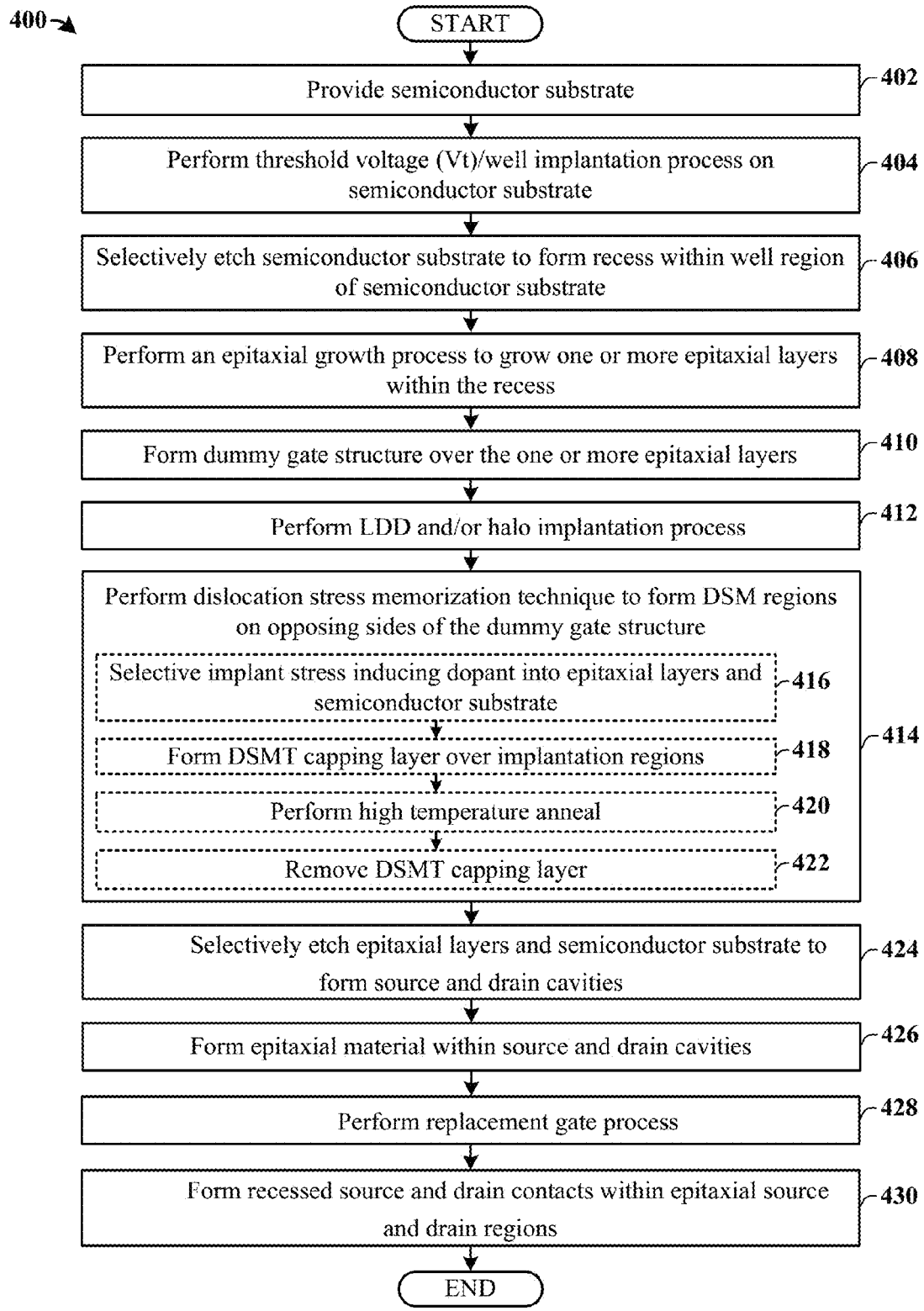
FIG. 4 illustrates a flow diagram of some additional embodiments of a method of forming a transistor device having epitaxial source and drain regions comprising DSM regions configured to provide stress to an epitaxial channel region.

FIG. 4 illustrates a flow diagram of some additional embodiments of a method 400 of forming a transistor device having epitaxial source and drain regions comprising DSM regions configured to provide stress to an epitaxial channel region.

While disclosed methods (e.g., methods 300 and 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a semiconductor substrate is provided. In various embodiments, the semiconductor substrate may comprise any type of semiconductor body (e.g., silicon, silicon-germanium, silicon-on-insulator, etc.) such as a semiconductor wafer and/or one or more die on a semiconductor wafer, as well as any other type of semiconductor and/or epitaxial layers associated therewith.

At 404, a well/$V_t$ implantation process is performed to introduce dopants into the semiconductor substrate. In some embodiments, a well anneal process may be performed on the semiconductor substrate after the well/Vt implantation process to activate dopants introduced by the well/$V_t$ implantation process.

At 406, the semiconductor substrate is selectively etched to form a recess within the well region along a top surface of the semiconductor substrate.

At 408, an epitaxial growth process is performed to grow one or more epitaxial layers within the recess. In some embodiments, the one or more epitaxial layers may comprise a carbon doped epitaxial layer and an overlying un-doped epitaxial layer having no dopants (i.e., having an intrinsic doping concentration of approximately $1e15$ $cm^{-3}$).

At 410, a dummy gate structure is formed over the one or more epitaxial layers.

At 412, an LDD (lightly doped drain) and/or halo implantation process is performed. The LDD/halo implantation process introduces dopants into the semiconductor substrate.

At 414, a dislocation stress memorization technique (DSMT) is performed to form DSM regions on opposing sides of the dummy gate structure. In some embodiments, the DSM regions may have a stressed lattice that has a smaller distance between atoms than normal (i.e., the lattice constant of the DSM region is smaller than the natural lattice constant not being stressed). In other embodiments, the DSM regions may have a stressed lattice that has a larger distance between atoms than normal.

In some embodiments, the DSMT may be performed by selectively implanting a stress inducing dopant into the one or more epitaxial layers and the underlying semiconductor substrate to form implantation regions at positions corresponding to source and drain regions of the transistor device, at 416. A DSMT capping layer is formed over the implantation regions, at 418. A high temperature anneal is performed, at 420. The high temperature anneal causes the DSMT capping layer to form a re-crystallized amorphous material having stacking defects along (111) planes. The stacking defects induce a stress in the implantation regions, thereby forming the DSM regions. At 422, the DSMT capping layer is removed.

At 424, the one or more epitaxial layers and the underlying semiconductor substrate are selectively etched to form source and drain cavities. The selectively etch removes a portion of the DSM regions (formed at act 414), such that a bottom surface of the source and drain cavities abuts the DSM regions.

At 426, epitaxial material (e.g., silicon phosphate) is formed within the source and drain cavities to form an epitaxial source region and an epitaxial drain region. Since the epitaxial material is grown onto a portion of the DSM regions, the epitaxial material will have a stressed lattice due to the stressed lattice of the DSM regions, thereby causing the stacking defects of the re-crystallized amorphous to extend along (111) planes to positions within the epitaxial source and drain regions.

At 428, a replacement gate process is performed to replace the dummy gate structure with a gate dielectric layer and an overlying replacement metal gate electrode layer. In various embodiments, the dummy gate structure may be removed by a wet etching process and/or a dry etching process. In various embodiments, the gate dielectric layer may comprise an inter-layer gate dielectric layer or a high-k gate dielectric layer formed by a deposition technique.

At 430, recessed source and drain contacts are formed within the epitaxial source and drain regions, respectively. The stacking defects may extend to a position abutting the recessed source and drain contacts.

FIGS. 5-12 illustrate some embodiments of cross-sectional views of a semiconductor substrate showing a method of forming a transistor device having epitaxial source and drain regions comprising DSM regions configured to provide stress to an epitaxial channel region. Although FIGS. 5-12 are described in relation to method 400, it will be appreciated that the structures disclosed in FIGS. 5-12 are not limited to such a method.

Figure 5:
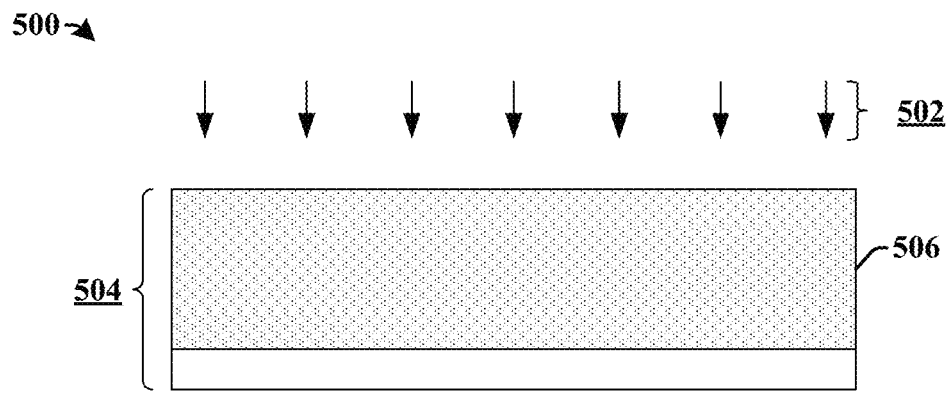
FIGS. 5-12 illustrate some embodiments of cross-sectional views of a semiconductor substrate showing a method of forming a transistor device having epitaxial source and drain regions comprising DSM regions configured to provide stress to an epitaxial channel region

FIG. 5 illustrates a cross-sectional view 500 of some embodiments of a semiconductor substrate corresponding to acts 402-404.

As shown in cross-sectional view 500, a voltage threshold ($V_t$)/well implantation 502 is performed on the semiconductor substrate 504. The $V_t$/well implantation 502 is configured to introduce dopants 506 into the semiconductor substrate 504 to adjust the $V_t$ (threshold voltage) applied to a transistor to allow current to flow in a channel region. In some embodiments, the $V_t$/well implantation 502 may introduce a p-type dopant (e.g., boron) into the semiconductor substrate 504, while in other embodiments the $V_t$/well implantation 502 may introduce an n-type dopant (e.g., phosphorous, antimony, or arsenic) into the semiconductor substrate 504.

In some embodiments, a well anneal process may be subsequently performed to activate the implanted dopants 506 introduce by the $V_t$/well implantation 502. The well anneal process is performed by exposing the semiconductor substrate 504 to an elevated temperature (e.g., greater than or equal to 400° C.). The well anneal process may also cure crystalline defects and/or cause diffusion and redistribution of dopant impurities to drive the implanted dopants 506 deeper into the semiconductor substrate 504 to from a well region.

Figure 6:
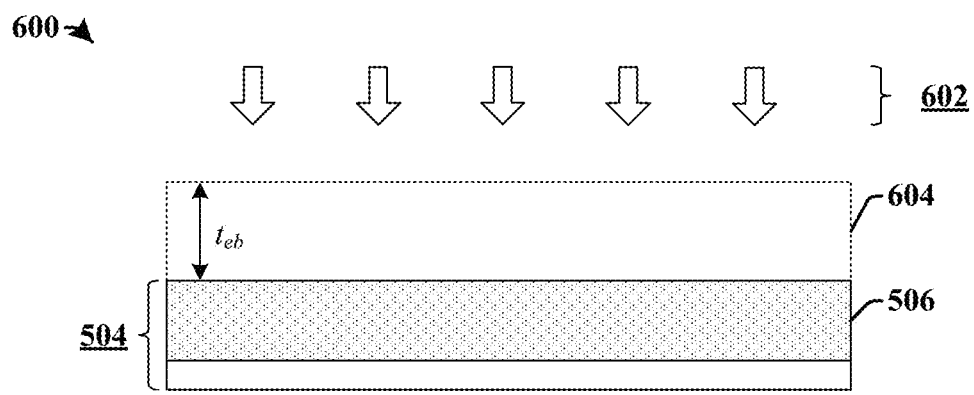

FIG. 6 illustrates a cross-sectional view 600 of some embodiments of a semiconductor substrate corresponding to act 406.

As shown in cross-sectional view 600, the semiconductor substrate 504 is exposed to an etchant 602 that is configured to form a recess 604 within the semiconductor substrate 504 (i.e., to reduce the thickness of a portion of the semiconductor substrate 504). In some embodiments, the etchant 602 is configured to remove a thickness $t_{eb}$ of a portion of the semiconductor substrate 504 that is between approximately 5 nm and approximately 30 nm, for example. In some embodiments, the etchant 602 may comprise a dry etchant (e.g., an ion bombardment) and/or a wet etchant (e.g., Tetramethylammonium hydroxide (TMAH), potassium hydroxide (KOH), etc.).

Figure 7:
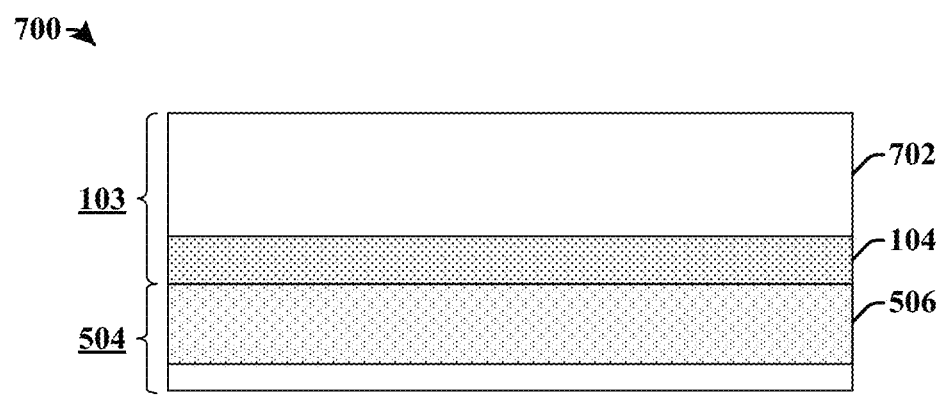

FIG. 7 illustrates a cross-sectional view 700 of some embodiments of a semiconductor substrate corresponding to act 408.

As shown in cross-sectional view 700, a carbon doped epitaxial layer 104 (e.g., silicon carbide (SiC) layer) is epitaxially grown within the recess 604 at a position overlying the semiconductor substrate 504. An un-doped epitaxial layer 702 (e.g., an un-doped silicon layer) is epitaxially grown within the recess 604 at a position overlying the carbon doped epitaxial layer 104. In some embodiments, the carbon doped epitaxial layer 104 may be grown to a thickness having a range of between approximately 2 nm and approximately 15 nm, and the un-doped epitaxial layer 702 may be grown to a thickness of between approximately 5 nm and approximately 30 nm. In some embodiments, the carbon doped epitaxial layer 104 may have a carbon concentration of approximately less than 1%. Such a carbon concentration allows for the carbon doped epitaxial layer 104 to be subsequently etched (e.g., in act 422).

In some embodiments, an oxidation process may subsequently be performed after formation of the carbon doped epitaxial layer 104 and the un-doped epitaxial layer 702 to form a thin oxide on a top surface of the un-doped epitaxial layer 702. The oxidation process comprises a high temperature anneal, which may cause back diffusion of dopants from the well region to the carbon doped epitaxial layer 104 and the un-doped epitaxial layer 702. Back diffusion of dopants into the un-doped epitaxial layer 702 causes the un-doped silicon layer to form a lightly doped epitaxial layer 106.

Figure 8:
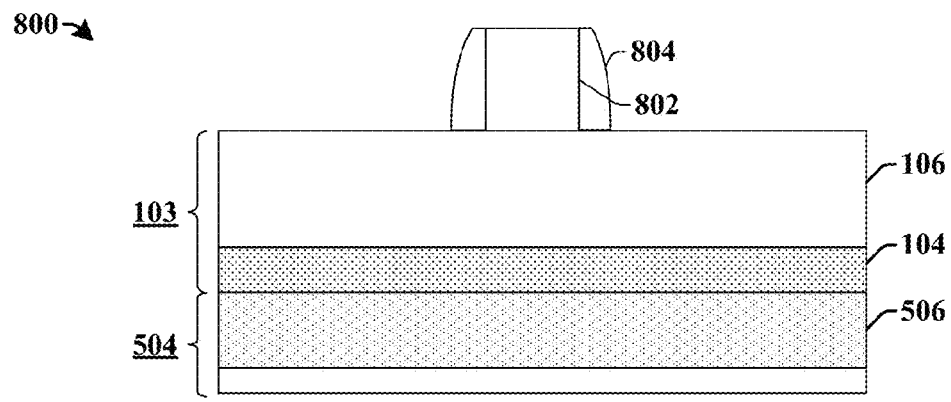

FIG. 8 illustrates a cross-sectional view 800 of some embodiments of a semiconductor substrate corresponding to act 410.

As shown in cross-sectional view 800, a dummy gate structure 802 is formed over the lightly-doped epitaxial layer 106. In some embodiments, the dummy gate structure 802 may comprise a polysilicon layer deposited onto the lightly-doped epitaxial layer 106 using a deposition technique (e.g., chemical vapor deposition, physical vapor deposition, etc.). Sidewall spacers 804 may be formed on the outer sidewalls of the dummy gate structure 802. In some embodiments, the sidewall spacers 804 may be formed by depositing nitride onto the lightly-doped epitaxial layer 106 and selectively etching the nitride to form the sidewall spacers 804.

Figure 9:
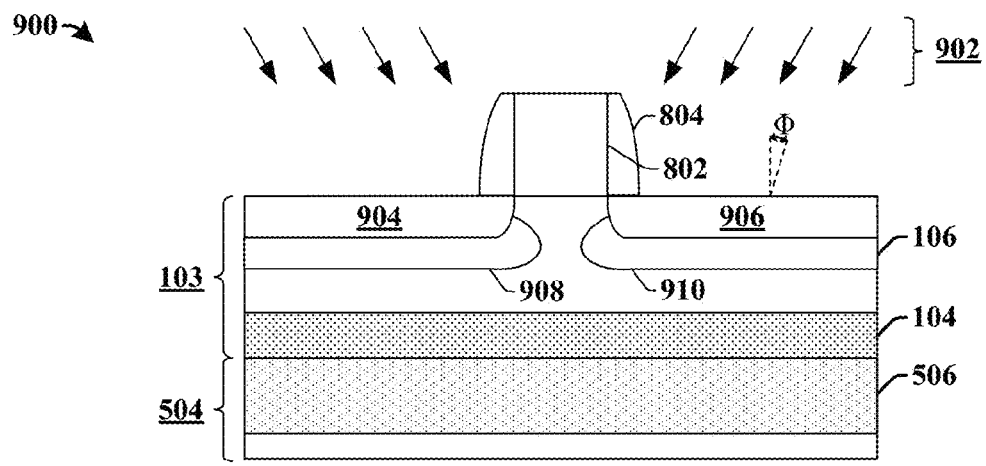

FIG. 9 illustrates a cross-sectional view 900 of some embodiments of a semiconductor substrate corresponding to act 412.

As shown in cross-sectional view 900, an LDD and/or halo implantation 902 is performed. The LDD and/or halo implantation 902 introduces dopants through an upper surface of the lightly-doped epitaxial layer 106. The LDD implantation is configured to form LDD impurity regions, 904 and 906, having a doping type that is different than that of well/$V_t$ implantation. The halo implantation is configured to form halo implantation regions, 908 and 910, having an opposite doping type as the LDD implantation into the periphery, but not the central portion, of a channel region. In some embodiments, the halo implantation 902 may be performed at a tilt angle $\Phi$ with respect to a top surface of the lightly-doped epitaxial layer 106. In some embodiments, the tilt angle $\Phi$ may be 20° or less. Although cross-sectional view 900 illustrates the halo implantation as being performed prior to the formation of source and drain regions (e.g., regions 108a and 108b), it will be appreciated that in alternative embodiments the halo implantation may be performed after formation of the source and drain regions.

Figure 10A:
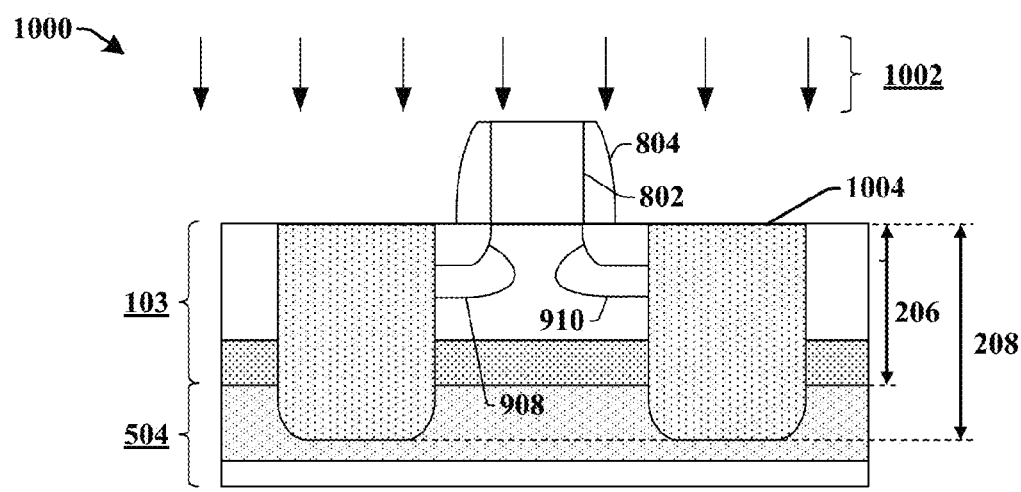
Figure 10B:
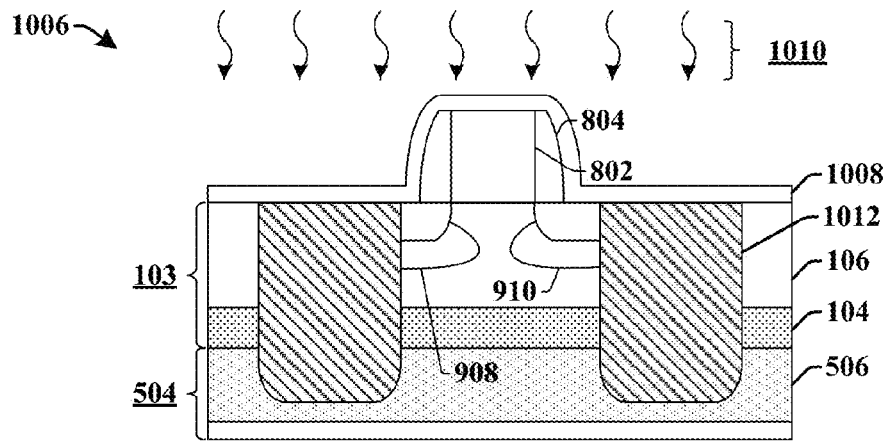
Figure 10C:
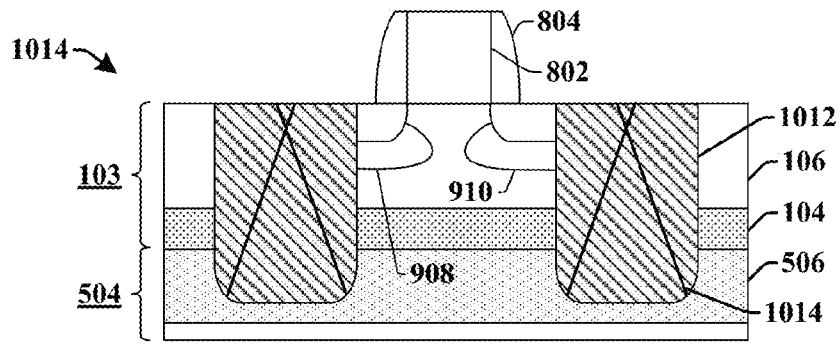

FIG. 10A-10C illustrates cross-sectional views of some embodiments of a semiconductor substrate corresponding to act 414.

As shown in cross-sectional view 1000 of FIG. 10A, an implantation 1002 is performed to form amorphous regions 1004. The amorphous regions 1004 extend from a top surface of the epitaxial stack 103 to a position within the semiconductor substrate 504 underlying the epitaxial stack 103, so that a height of the amorphous regions 1004 is greater than a height of the epitaxial stack 103. In some embodiments, the implantation 1002 may be configured to implant a dopant species comprising germanium. In some embodiments, the implantation 1002 may be configured to implant a low temperature germanium pre-amorphous implant at an implant dose less than approximately 2e15. In some embodiments, the temperature germanium pre-amorphous implant may cool the germanium dopant species to a temperature of between −50° C. and −200° C. prior to implantation 1002.

As shown in cross-sectional view 1006 of FIG. 10B, a DSMT cap layer 1008 (e.g., a nitride layer) is formed over the amorphous regions 1004. A high temperature anneal 1010 is then performed. During the high temperature anneal 1010 the lattice of the amorphous regions 1004 are re-crystallized. The growth of the re-crystallized lattice will occur under stress conditions induced by the DSMT cap layer 1008 and result in re-crystallized amorphous regions 1012. The re-crystallized amorphous regions 1012 comprise a stacking defect 1014 along a (111) plane. The stacking defect 1014 distorts the lattice of the amorphous regions 1004 thereby affecting bond length. For example, a compressive capping layer may induce a stacking defect that distorts the lattice of the amorphous regions to form a smaller bonding length leading to tensile stress.

As shown in cross-sectional view 1014 of FIG. 10C, the DSMT cap layer 1008 is removed. Since the re-crystallized regions 1012 memorize the stress induced by the DSMT cap layer 1008, when the DSMT cap layer 1008 is removed the re-crystallized regions 1012 maintain their stressed lattice configurations.

Figure 11A:
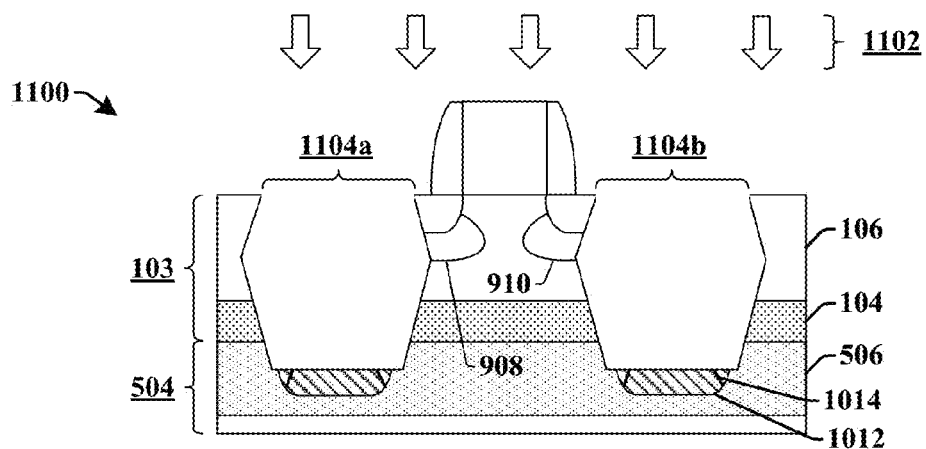
Figure 11B:
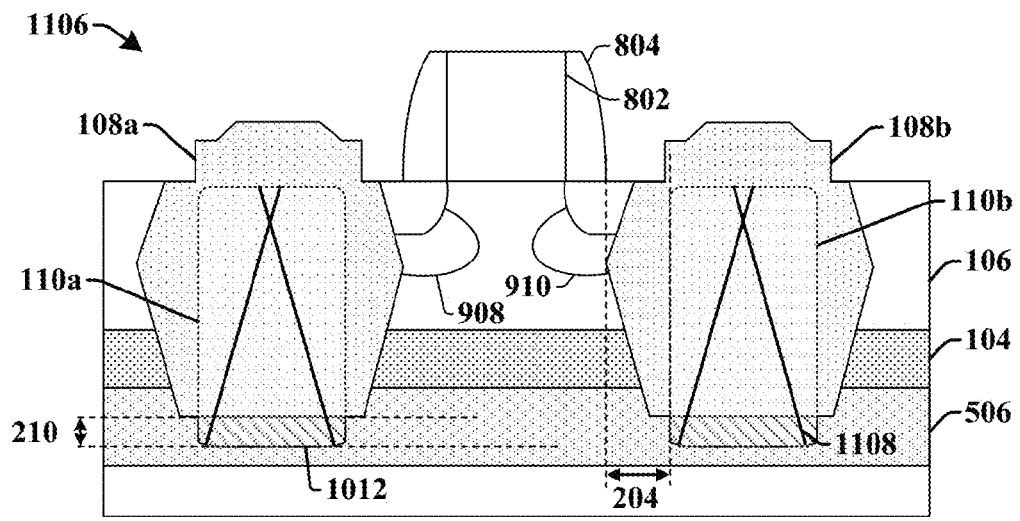

FIGS. 11A-11B illustrates a cross-sectional view 1100 of some embodiments of a semiconductor substrate corresponding to acts 424-426.

As shown in cross-sectional view 1100 of FIG. 11A, an etchant 1102 is configured to selectively form a source cavity 1104a and a drain cavity 1104b. The source and drain cavities, 1104a and 1104b, extend from a top surface of the epitaxial stack 103 to a position above the bottom surface of the re-crystallized regions 1012. For example, in some embodiments, the source and drain cavities, 1104a and 1104b, may extend from a top surface of the epitaxial stack 103 to a position approximately greater than or equal to approximately 2 nm above the bottom surface of the re-crystallized regions 1012.

In some embodiments, the etchant 1102 may comprise a multi-step etching process. For example, a first etching process may be used to form cavities comprising a U-shaped etch profile. In some embodiments, the first etching process may comprise a dry etch, wet etch, plasma etch, RIE etch, or a combination thereof. A second, anisotropic etch process may be subsequently performed on the cavities. In some embodiments, the anisotropic etch comprises a wet etch which utilizes TMAH as an etchant configured for preferred etch selectivity in the <100> direction of the Si or SOI substrate. The resultant etch profile of the source and drain cavities, other than the bottom surface, comprises a (100) crystal orientation after the anisotropic etch.

As shown in cross-sectional view 1106 of FIG. 11B, a stress-inducing material is epitaxially deposited within the source and drain cavities, 1104a and 1104b, to form epitaxial source and drain regions, 108a and 108b. In some embodiments, the stress inducing material may comprise silicon phosphate (SiP). In other embodiments, the stress-inducing material may comprise other materials (e.g., SiGe or a carbon-containing material such as SiC). The stacking defects 1108 along the (111) planes extend into the epitaxial source and drain regions, 108a and 108b, to form DSM regions, 110a and 110b, since the stress-inducing material is epitaxial grown onto the underlying re-crystallized regions 1012, which have strained lattice due to the DSMT process (act 414).

Figure 12:
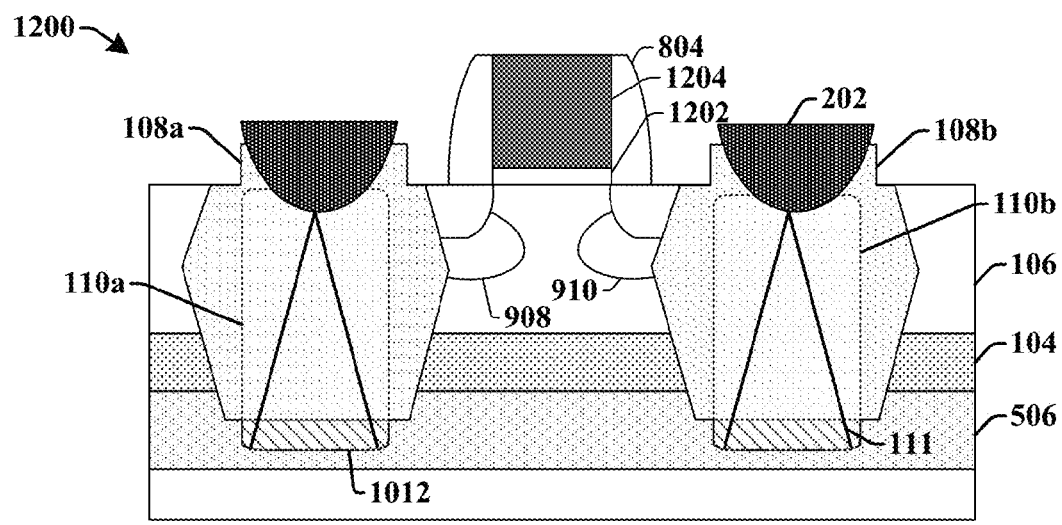

FIG. 12 illustrates a cross-sectional view 1200 of some embodiments of a semiconductor substrate corresponding to acts 428-430.

As shown in cross-sectional view 1200, a replacement gate process is performed. The replacement gate process removes the dummy gate structure 802 and forms an inter-layer gate dielectric layer or a high-k gate dielectric layer 1202 at a position replacing the dummy gate structure 802 (i.e., between sidewall spacers 804) using a deposition technique (e.g., chemical vapor deposition, physical vapor deposition, etc.). A replacement metal gate electrode layer 1204 is deposited over gate dielectric layer 1202 using a deposition technique. In some embodiments, the replacement metal gate electrode layer 1204 may comprise aluminum, for example.

Recessed source and drain contacts, 112a and 112b, are respectively formed within the epitaxial source and drain regions, 108a and 108b. The recessed source and drain contacts, 112a and 112b, may be formed by selectively etching the epitaxial source and drain regions, 108a and 108b, and then depositing a contact material using a deposition technique. In some embodiments, the recessed source and drain contacts, 112a and 112b, may comprise nickel. In some embodiments, etching the epitaxial source and drain regions, 108a and 108b, to form the recessed source and drain contacts, 112a and 112b, will remove a section of the DSM regions, 110a and 110b. For example, in some embodiments, top surfaces of the DSM regions, 110a and 110b, may have a divot or recess comprising the recessed source and drain contacts, 112a and 112b.

Therefore, the present disclosure relates to a transistor device having epitaxial source and drain regions comprising dislocation stress memorization (DSM) regions configured to provide stress to an epitaxial channel region, and an associated method of formation.

In some embodiments, the present disclosure relates to a transistor device. The transistor device comprises an epitaxial source region arranged within a substrate, and an epitaxial drain region arranged within the substrate and separated from the epitaxial source region by a channel region. The transistor device further comprises first and second dislocation stress memorization (DSM) regions having stressed lattices configured to generate stress within the channel region. The first DSM region extends from below the epitaxial source region to a first location within the epitaxial source region. The second DSM region extends from below the epitaxial drain region to a second location within the epitaxial drain region.

In other embodiments, the present disclosure relates to a transistor device. The transistor device comprises an epitaxial source region separated from an epitaxial drain region by a channel region underlying a gate structure. A first dislocation stress memorization (DSM) region comprising a first stressed lattice is arranged within and is laterally offset from opposing sidewalls of the epitaxial source region. A second DSM region comprising a second stressed lattice is arranged within and is laterally offset from opposing sidewalls of the epitaxial drain region.

In yet other embodiments, the present disclosure relates to a transistor device. The transistor device comprises an epitaxial source region separated from an epitaxial drain region by a channel region underlying a gate structure. A first stacking defect is arranged within and is laterally offset from opposing sidewalls of the epitaxial source region. A second stacking defect is arranged within and is laterally offset from opposing sidewalls of the epitaxial drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor device, comprising:
   an epitaxial source region arranged within a substrate;
   an epitaxial drain region arranged within the substrate and separated from the epitaxial source region by a channel region; and
   first and second dislocation stress memorization (DSM) regions comprising stressed lattices configured to generate stress within the channel region, wherein the first DSM region extends from below the epitaxial source region to a first location within the epitaxial source region and the second DSM region extends from below the epitaxial drain region to a second location within the epitaxial drain region.

2. The transistor device of claim 1, further comprising:
   a gate structure arranged over the channel region, wherein the first DSM region is separated from the gate structure by the epitaxial source region and the second DSM region is separated from the gate structure by the epitaxial drain region.

3. The transistor device of claim 1, wherein the epitaxial source region comprises a protrusion extending outward from an upper surface of the epitaxial source region.

4. The transistor device of claim 3, wherein the protrusion extends outward to a location over a top surface of the substrate.

5. The transistor device of claim 1, further comprising:
   a recessed source contact located within a recess disposed along a top surface of the epitaxial source region, wherein the first DSM region extends from a location below the epitaxial source region to a lower surface of the recessed source contact.

6. The transistor device of claim 1, wherein the first DSM region comprises a stacking defect.

7. The transistor device of claim 1, wherein the first DSM region is arranged within and laterally offset from opposing sidewalls of the epitaxial source region.

8. The transistor device of claim 1, wherein the first DSM region extends to a distance below the epitaxial source region that is greater than approximately 2 nm.

9. The transistor device of claim 1, wherein the epitaxial source region and the epitaxial drain region comprise silicon phosphate.

10. The transistor device of claim 1, wherein the first DSM region and the second DSM region comprise an n-type dopant species.

11. The transistor device of claim 10, wherein the n-type dopant species comprises germanium.

12. The transistor device of claim 1, wherein the epitaxial source region is substantially symmetric about an axis of symmetry vertically bisecting the epitaxial source region, and wherein the first DSM region is arranged along the axis of symmetry.

13. A transistor device, comprising:
    an epitaxial source region separated from an epitaxial drain region by a channel region underlying a gate structure;
    a first dislocation stress memorization (DSM) region comprising a first stressed lattice arranged within and laterally offset from opposing sidewalls of the epitaxial source region; and
    a second DSM region comprising a second stressed lattice arranged within and laterally offset from opposing sidewalls of the epitaxial drain region.

14. The transistor device of claim 13, wherein the first and second DSM regions respectively extend below bottom surfaces of the epitaxial source region and the epitaxial drain region.

15. The transistor device of claim 13, wherein epitaxial source region is substantially symmetric about an axis of symmetry vertically bisecting the epitaxial source region, and wherein the first DSM region is arranged along the axis of symmetry.

16. The transistor device of claim 13, wherein the gate structure comprises:
    a gate electrode separated from the channel region by a gate dielectric layer; and
    sidewall spacers arranged on opposing sides of the gate electrode.

17. The transistor device of claim 13, wherein the epitaxial source region and the epitaxial drain region laterally extend below the gate structure.

18. The transistor device of claim 13, wherein the first DSM region and the second DSM region comprise a re-crystallized amorphous material.

19. A transistor device, comprising:
    an epitaxial source region separated from an epitaxial drain region by a channel region underlying a gate structure;
    a first stacking defect arranged within and laterally offset from opposing sidewalls of the epitaxial source region; and
    a second stacking defect arranged within and laterally offset from opposing sidewalls of the epitaxial drain region.

20. The transistor device of claim 19, wherein the first stacking defect extends from within the epitaxial source region to below the epitaxial source region.

* * * * *